US012585852B1

(12) United States Patent
Shelar et al.

(10) Patent No.: US 12,585,852 B1
(45) Date of Patent: Mar. 24, 2026

(54) MULTIPLEXING SCHEME FOR MULTI-CLOCK PROTOTYPING

(71) Applicant: Cadence Design Systems, Inc., San Jose, CA (US)

(72) Inventors: Rupesh S. Shelar, Hillsboro, OR (US); Akash Sharma, Livermore, CA (US); Sanjay Dhar, Lake Oswego, OR (US)

(73) Assignee: Cadence Design Systems, Inc., San Jose, CA (US)

( * ) Notice: Subject to any disclaimer, the term of this patent is extended or adjusted under 35 U.S.C. 154(b) by 806 days.

(21) Appl. No.: 17/984,102

(22) Filed: Nov. 9, 2022

(51) Int. Cl.
*G06F 30/347* (2020.01)

(52) U.S. Cl.
CPC .................................. *G06F 30/347* (2020.01)

(58) Field of Classification Search
CPC ...................................................... G06F 30/347
USPC ........................................................ 716/117
See application file for complete search history.

(56) References Cited

U.S. PATENT DOCUMENTS

| | | | | |
|---|---|---|---|---|
| 8,984,203 | B2 * | 3/2015 | Liu ..................... | G06F 13/1684 |
| | | | | 710/33 |
| 10,282,501 | B1 * | 5/2019 | Ramabadran ......... | G06F 30/331 |
| 10,878,154 | B1 * | 12/2020 | Badaoui .............. | G06F 30/3312 |
| 12,099,790 | B1 * | 9/2024 | Dikshit ................ | G06F 30/331 |
| 2012/0151243 | A1 * | 6/2012 | Ono ........................ | G06F 5/12 |
| | | | | 713/400 |
| 2018/0189641 | A1 * | 7/2018 | Boesch .................. | G06N 3/045 |
| 2019/0227963 | A1 * | 7/2019 | Ooi ......................... | G06F 30/34 |

* cited by examiner

*Primary Examiner* — Suchin Parihar
(74) *Attorney, Agent, or Firm* — Schwegman Lundberg & Woessner, P.A.

(57) ABSTRACT

Aspects of the present disclosure address systems and methods for multi-clock prototyping. Data representing an integrated circuit design is accessed. The integrated circuit design comprises multiple partitions and specifies a set of cut nets between a first partition and a second partition. A plurality of clock domains among the set of cut nets is identified. A clock domain comprises a subset of cut nets from the set of cut nets. A multiplexer/demultiplexer pair is assigned to each clock domain. Bandwidth allocations for the plurality of clock domains are computed. The bandwidth allocation for a given clock domain corresponds to a number of links between the first partition and the second partition allocated to a multiplexer/demultiplexer pair assigned to the clock domain. A prototype of the integrated circuit design is implemented based on the bandwidth allocations.

20 Claims, 6 Drawing Sheets

300

305
ACCESS DATA DESCRIBING INTEGRATED CIRCUIT (IC) DESIGN

310
IDENTIFY MULTIPLE CLOCK DOMAINS IN DESIGN

315
ASSIGN A MULTIPLEXER/DEMULTIPLEXER PAIR TO EACH CLOCK DOMAIN

320
DETERMINE BANDWIDTH ALLOCATIONS FOR EACH CLOCK DOMAIN

325
IMPLEMENT PROTOTYPE BASED ON BANDWIDTH ALLOCATIONS

300

305
ACCESS DATA DESCRIBING INTEGRATED CIRCUIT (IC) DESIGN

310
IDENTIFY MULTIPLE CLOCK DOMAINS IN DESIGN

315
ASSIGN A MULTIPLEXER/DEMULTIPLEXER PAIR TO EACH CLOCK DOMAIN

320
DETERMINE BANDWIDTH ALLOCATIONS FOR EACH CLOCK DOMAIN

325
IMPLEMENT PROTOTYPE BASED ON BANDWIDTH ALLOCATIONS

300

MULTIPLEXING SCHEME FOR MULTI-CLOCK PROTOTYPING

TECHNICAL FIELD

The present disclosure generally relates to the technical field of integrated circuit (IC) design. In particular, the present disclosure addresses a multiplexing scheme for multi-clock prototyping.

BACKGROUND

An IC comprises multiple circuit components referred to as "cells" and connections between or among the cells. A cell typically includes several pins interconnected by wires to pins of one or more other cells.

Design engineers design ICs by transforming descriptions of the ICs into geometric descriptions, called layouts. To create layouts, design engineers typically use electronic design automation (EDA) applications. These applications provide sets of computer-based tools for creating, editing, and analyzing IC design layouts.

EDA applications create layouts by using geometric shapes that represent different materials and components of an IC. For instance, EDA tools commonly use rectilinear lines to represent the wire segments that interconnect cells. These tools also represent cells as geometric objects with varying shapes and sizes.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Figure 1:
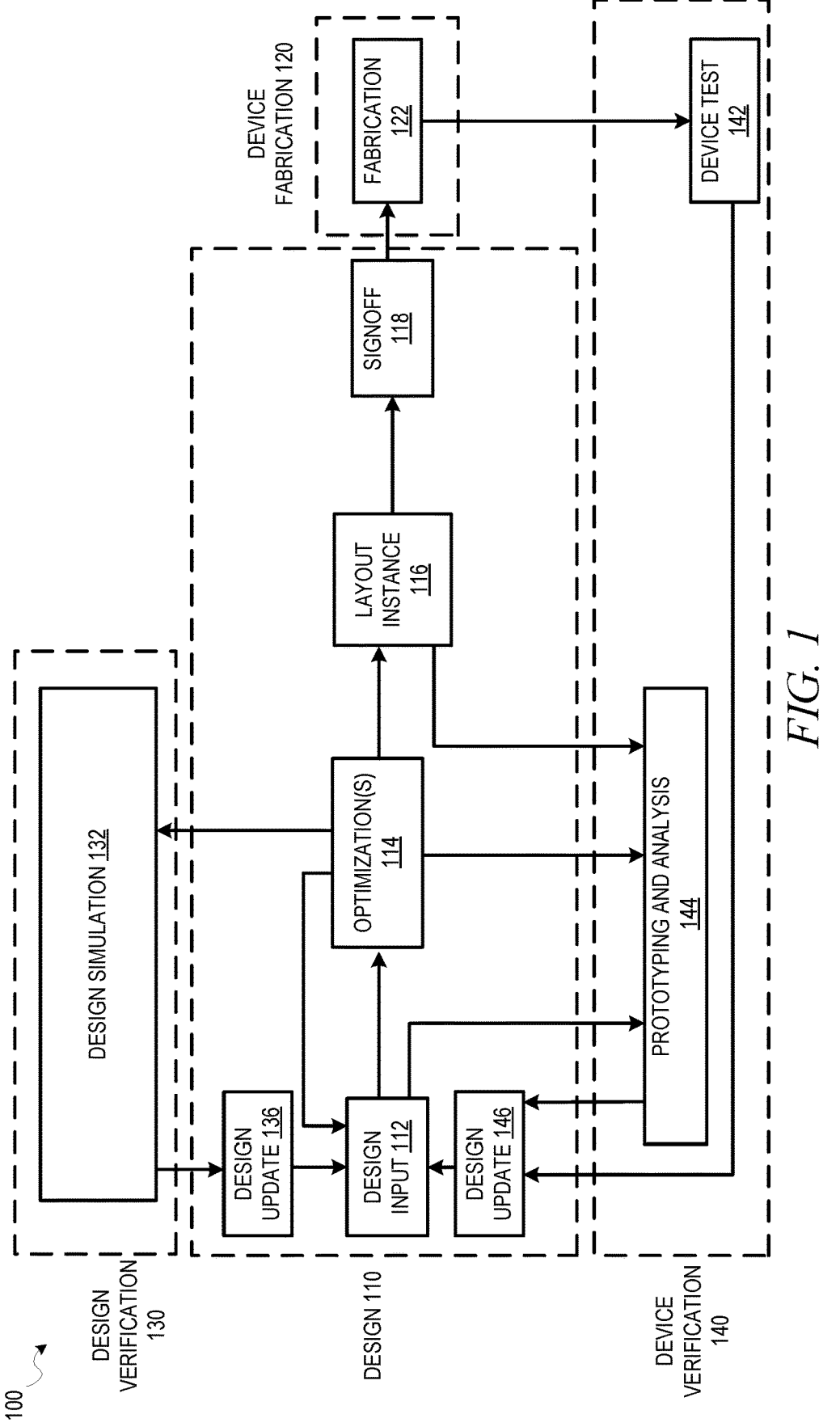
FIG. 1 is a diagram illustrating an example IC design flow that includes a multiplexing scheme for multi-clock prototyping that includes bandwidth allocation techniques, according to some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

The EDA process for IC design entails various operations including prototyping. Prototyping is performed to verify that the functionality of an IC design is correct. Field-programmable gate array (FPGA) prototyping is often used for system-on-chip and application-specific integrated circuit (ASIC) designs. With FPGA prototyping, IC designs are prototyped on FPGAs for hardware verification and early software development.

Large IC designs are often partitioned into multiple partitions and each partition may be implemented on respective FPGAs. For example, an IC design may include a first partition and a second partition. Each of the partitions can include multiple flip-flops and other logic components. The first partition may be implemented on a first FPGA and the second partition may be implemented on a second FPGA.

For these large designs with multiple partitions, time-division multiplexing (TDM) is used for cut nets that cross different partitions (e.g., different FPGAs) because the number of cut nets typically exceeds the number of pins connecting two FPGAs. Each cut net corresponds to a timing path that connects a first component on a first partition (e.g., a first FPGA) to a second component on a second partition (e.g., a second FPGA). Cut nets between two partitions can be grouped into multiple clock domains, each of which is associated with a different design clock (each having a different clock frequency). With conventional prototyping schemes, cut nets between two partitions are assigned to a single multiplexer/demultiplexer pair and all timing paths are required to finish all computations in one clock cycle of a reference clock regardless of the clock domain to which they belong. Depending on number of links in the multiplexer/demultiplexer pair (i.e., the number of pins connecting the multiplexer to the demultiplexer) and the number of cuts nets assigned to it, multiplexing and demultiplexing can take several steps (or cycles) of step clock and can be a major component of a total number of steps required to finish all computations in a reference clock cycle.

Aspects of the present disclosure address limitations with conventional prototyping with an EDA system that facilitates multiple clock prototyping. Contrary to conventional prototyping solutions in which all data paths are evaluated using a single design clock signal, the EDA system allows for use of multiple design clock signals (also referred to herein simply as "design clocks") to verify timing paths as part of prototyping. That is, an IC design may specify a set of cut nets between a first partition and a second partition, and a first subset of cut nets may be clocked (e.g., evaluated as part of a timing analysis) using a first design clock with a first clock frequency, a second subset of cut nets may be clocked using a second design clock with a second clock frequency, a third subset of cut nets may be clocked using a third design clock with a third clock frequency, and so forth. Cut nets that are to be clocked using the same design clock are referred to as being in the same "clock domain."

Contrary to conventional prototyping, the EDA system assigns a multiplexer/demultiplexer pair to each clock domain to facilitate multi-clock prototyping. For example, a first multiplexer/demultiplexer pair is assigned to a first clock domain (comprising a first subset of cut nets), a second multiplexer/demultiplexer pair is assigned to a second clock domain (comprising a second subset of cut nets), and a third multiplexer/demultiplexer pair is assigned to a third clock domain (a third subset of cut nets).

In addition, the EDA system determines a bandwidth allocation for each clock domain. A bandwidth allocation for a given clock domain indicates a number of links for the multiplexer/demultiplexer pair assigned to the clock domain. The EDA system configures a given multiplexer/demultiplexer pair according to the bandwidth allocation determined for the clock domain group to which the multi-plexer/demultiplexer pair belongs. For some embodiments, the EDA system allocates bandwidth to each clock domain in proportion to a product of cut size (i.e., a number of cut nets in a clock domain) and frequency ratio (a ratio of the clock domain frequency to a slowest clock domain frequency). In this way, the EDA system allocates proportionately more bandwidth to fast clock domains, compared to slow clock ones (with low frequencies). For some embodiments, the EDA system iteratively improves bandwidth allocations by incrementally reducing bandwidth from minimum scaled latency domains and increasing bandwidth to maximum scaled latency domains to minimize the maximum scaled latency for multiplexing over all domains.

FIG. 1 is a diagram illustrating an example IC design flow 100 that includes application of a logic sharing transformation, according to some embodiments. It will be understood that any one or more aspects of the IC design flow 100 may be performed by a computing device executing instructions of an EDA system. For instance, one or more portions of the IC design flow 100 may be represented by executable instructions (e.g., EDA software) that, when executed by a processor of a computing device, cause the computing device to the corresponding portion of the IC design flow 100. Thus, an operation of the design flow 100 may be performed by a hardware processor (e.g., central processing unit (CPU) or graphics processing unit (GPU)) of a computing device (e.g., desktop, server, etc.).

As shown, the EDA design flow 100 includes a design phase 110, a device fabrication phase 120, a design verification phase 130, and a device verification phase 140.

The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

For some embodiments, the design phase 110 includes a high-level synthesis operation that includes receiving a high-level description of an IC design (e.g., in C/C++; as part of the initial design input 112) and converting the high-level description to a register-transfer level (RTL) file that represents circuitry via the utilization of interaction between registers. For some embodiments, the RTL file is received as part of the initial design input 112.

A timing analysis and one or more optimization operations may be performed with respect to the design at optimization(s) 114. As an example, these optimization(s) 114 can include resizing and buffering. While the design flow 100 shows the optimization(s) 114 occurring prior to layout instance 116, the timing analysis and the optimization operation(s) may be performed or repeated at any time (e.g., to verify or improve operation of a circuit design). For instance, in various embodiments, timing analysis in a circuit design may be performed prior to, during, or as part of logic synthesis, or as part of a signoff 118.

After design inputs are used in the design input 112 operation to generate a circuit layout, and any of the logic synthesis 113 and the optimization(s) 114 are performed, a layout is generated (the layout instance 116). The layout describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or prototyping and analysis operations 144. Once the device is generated, the device can be tested as part of device test 142 operations and layout modifications generated based on actual device performance.

As shown, the prototyping and analysis operations 144 can be performed as part of the device verification phase 140. As part of the prototyping and analysis operations 144, a prototype of an IC design is generated and analyzed to verify the functionality of the IC design. For some embodiments, a FPGA prototype is generated. Large IC designs are partitioned into multiple partitions and each partition may be implemented on a different FPGA. For these large designs with multiple partitions, TDM is used for cut nets that cross different partitions (e.g., different FPGAs) because the number of cut nets typically exceeds the number of pins connecting two FPGAs. Each cut net corresponds to a timing path that connects a first component on a first partition (e.g., a first FPGA) to a second component on a second partition (e.g., a second FPGA). Cut nets between two partitions are grouped into multiple clock domains, each of which is associated with a different design clock (each having a different clock frequency). A multiplexer/demultiplexer pair is assigned to each clock domain and a bandwidth allocation (a number of links in the multiplexer/demultiplexer pair) is determined for each clock domain based, for example, on cut size and clock domain frequency. Further details describing the determination of bandwidth allocation are discussed below.

A design update 136 from the design simulation 132 operations; a design update 146 from the device test 142 operations or the prototyping and analysis operations 144; or the design input 112 operation may occur after the initial layout instance 116 is generated. In various embodiments, whenever design inputs are used to update or change an aspect of a circuit design, further optimization(s) 114 may be performed.

Figure 2:
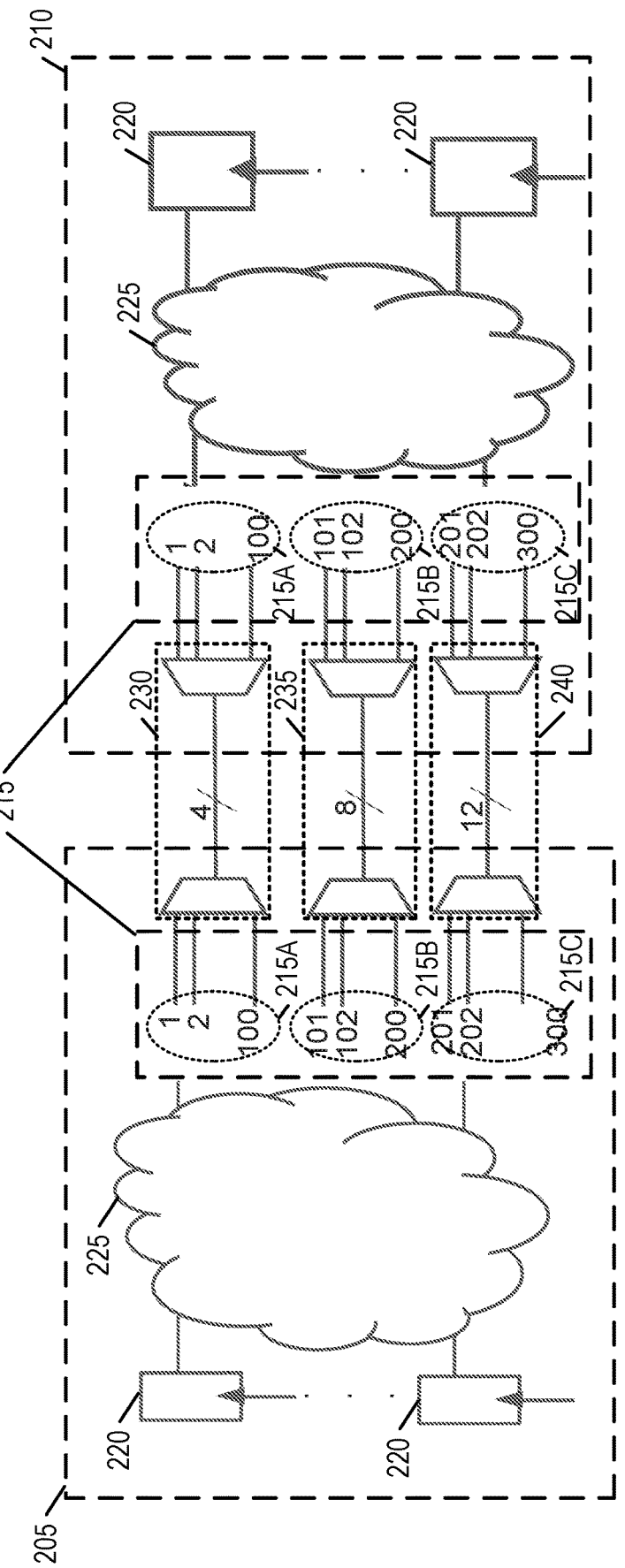
FIG. 2 is a diagram illustrating an example multi-clock prototyping process that includes a multiplexing scheme that utilizes bandwidth allocation techniques, according to some embodiments.

FIG. 2 is a diagram illustrating an example multi-clock prototyping process that includes a multiplexing scheme that utilizes bandwidth allocation techniques, according to some embodiments. The multi-clock prototyping process may be performed as part of the IC design flow 100. Hence, any one or more operations of the multi-clock prototyping process may be performed by a computing device executing instructions of an EDA system. Accordingly, the multi-clock prototyping process is described below in reference to the EDA system.

An IC design 200 is shown. The IC design 200 comprises two partitions-partition 205 and partition 210. As an example, the partition 205 may be implemented on a first FPGA and the partition 210 may be implemented on a second FPGA. As shown, each of the partitions 205 and 210 can include multiple flip-flops 220 and other logic components 225.

The IC design 200 includes multiple data paths between the partition 205 and the partition 210. Accordingly, the IC design 200 specifies a set of cut nets 215. The set of cut nets 215 includes subsets 215A, 215B, and 215C. Each cut net connects a flip-flop 220 or other logic component 225 in the partition 205 with a flip-flop 220 or other logic component 225 in the partition 210.

Contrary to conventional prototyping solutions in which all data paths are evaluated using a single design clock signal, the EDA system allows for use of multiple design clock signals to evaluate data paths as part of prototyping the IC design 200. That is, a first subset of cut nets may be clocked (e.g., evaluated as part of a timing analysis) using a first design clock with a first clock frequency, a second subset of cut nets may be clocked using a second design clock with a second clock frequency, a third subset of cut nets may be clocked using a third design clock with a third clock frequency, and so forth. Cut nets that are to be clocked using the same design clock are referred to as being in the same "clock domain." That is, a clock domain comprises one or more cut nets that are evaluated using the same design clock.

With conventional prototyping, a single multiplexer/demultiplexer pair is assigned to the set of cut nets 215 between the partition 205 and 210 and the multiplexer/demultiplexer pair is configured to include a number of links to enable the connections between components in the partition 205 and components in the partition 210. Typically, the number of links in the multiplexer/demultiplexer pair is much lower than the number of cut nets.

Contrary to conventional prototyping, the EDA system assigns a multiplexer/demultiplexer pair to each clock domain to facilitate multi-clock prototyping, as shown. For example, as shown, a first multiplexer/demultiplexer pair 230 is assigned to a first set of cut nets (subset 215A), a second multiplexer/demultiplexer pair 235 is assigned to a second set of cut nets (subset 215B), and a multiplexer/demultiplexer pair 240 is assigned to a third set of cut nets (subset 215C).

In addition, the EDA system determines a bandwidth allocation for each clock domain. A bandwidth allocation for a given clock domain indicates a number of links between the partition 205 and 210 to be used for the multiplexer/demultiplexer pair assigned to the clock domain. The EDA system configures a given multiplexer/demultiplexer pair according to the bandwidth allocation determined for the clock domain group to which the multiplexer/demultiplexer pair belong. That is, the EDA systems configures the FPGAs to include a multiplexer/demultiplexer pair with a number of input/output pins corresponding to the number of cut nets in the clock domain and to include the number of links corresponding to the bandwidth allocation.

For example, as shown, the total number of links between the partition 205 and the partition 210 (e.g., the number of pins connecting the first FPGA to the second FPGA) is 24. In this example, the first multiplexer/demultiplexer pair 230 is allocated 4 links based on a first bandwidth allocation determined for the first clock domain comprising the subset 215A, the second multiplexer/demultiplexer pair 235 is allocated 8 links based on a second bandwidth allocation determined for the second clock domain comprising the subset 215B, and the third multiplexer/demultiplexer pair 240 is allocated 12 links based on a third bandwidth allocation determined for the third clock domain comprising the subset 215C.

For some embodiments, the EDA system allocates bandwidth to each clock domain based on respective cut sizes and clock frequencies. Consistent with these embodiments, the EDA system may place higher weight on high frequency clock domains and allocate more bandwidth to the higher frequency clock domains. For some embodiments, the EDA system may iteratively refine bandwidth allocations to reduce a maximum scaled latency over all multiplexer/ demultiplexer pairs. Further details regarding the determination of bandwidth allocations are discussed below.

Figure 3:
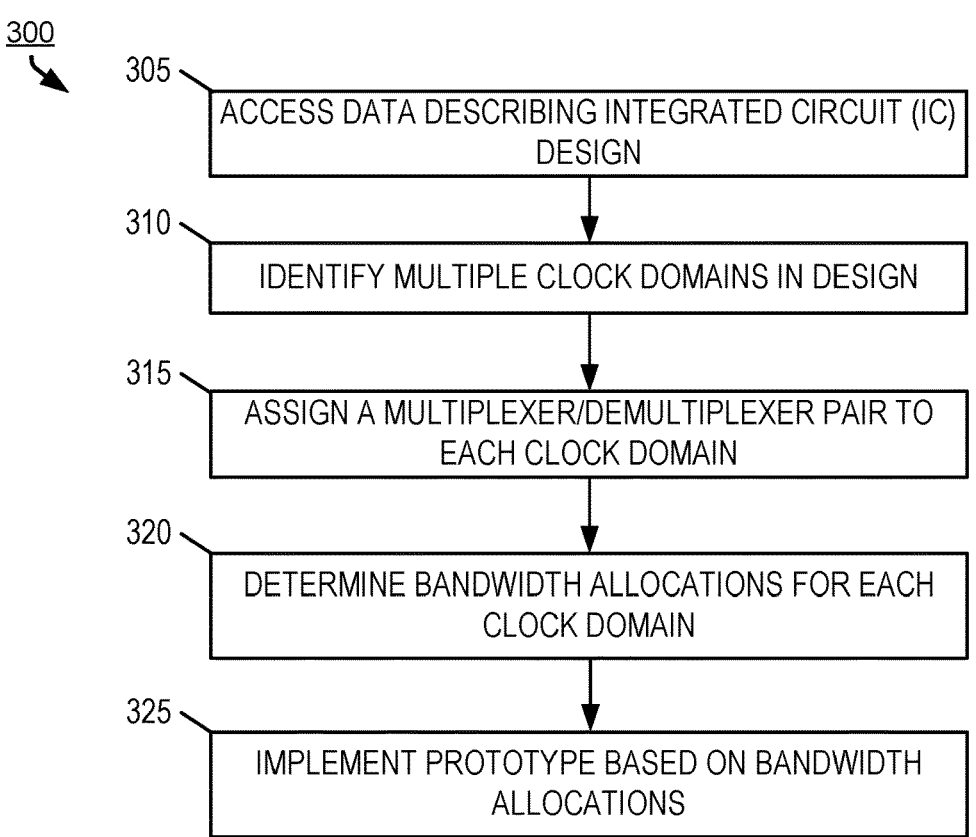
FIGS. 3-5 are flowcharts illustrating operations of a method for multi-clock prototyping that includes a multiplexing scheme that utilizes bandwidth allocation techniques, according to some example embodiments.
Figure 4:
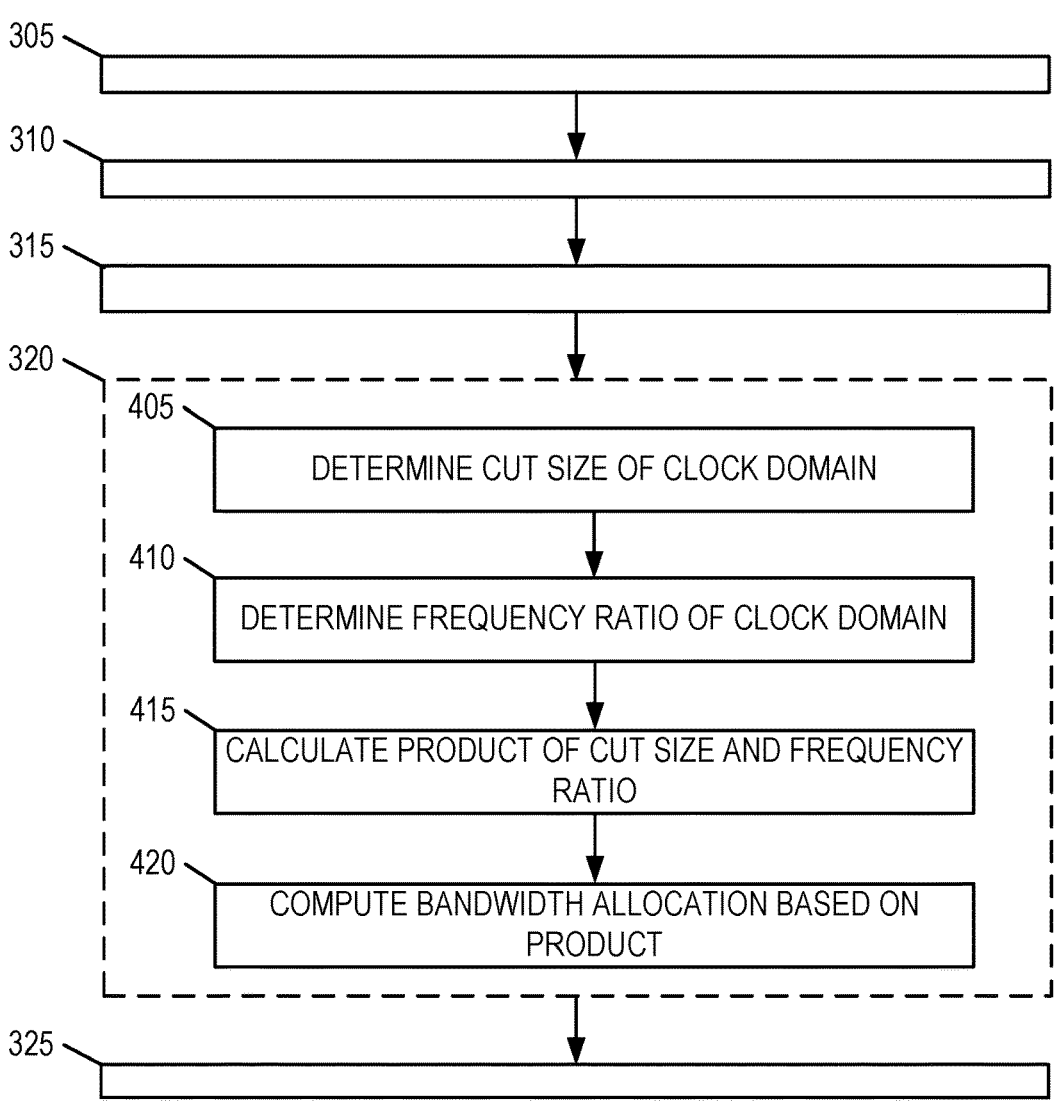
Figure 5:
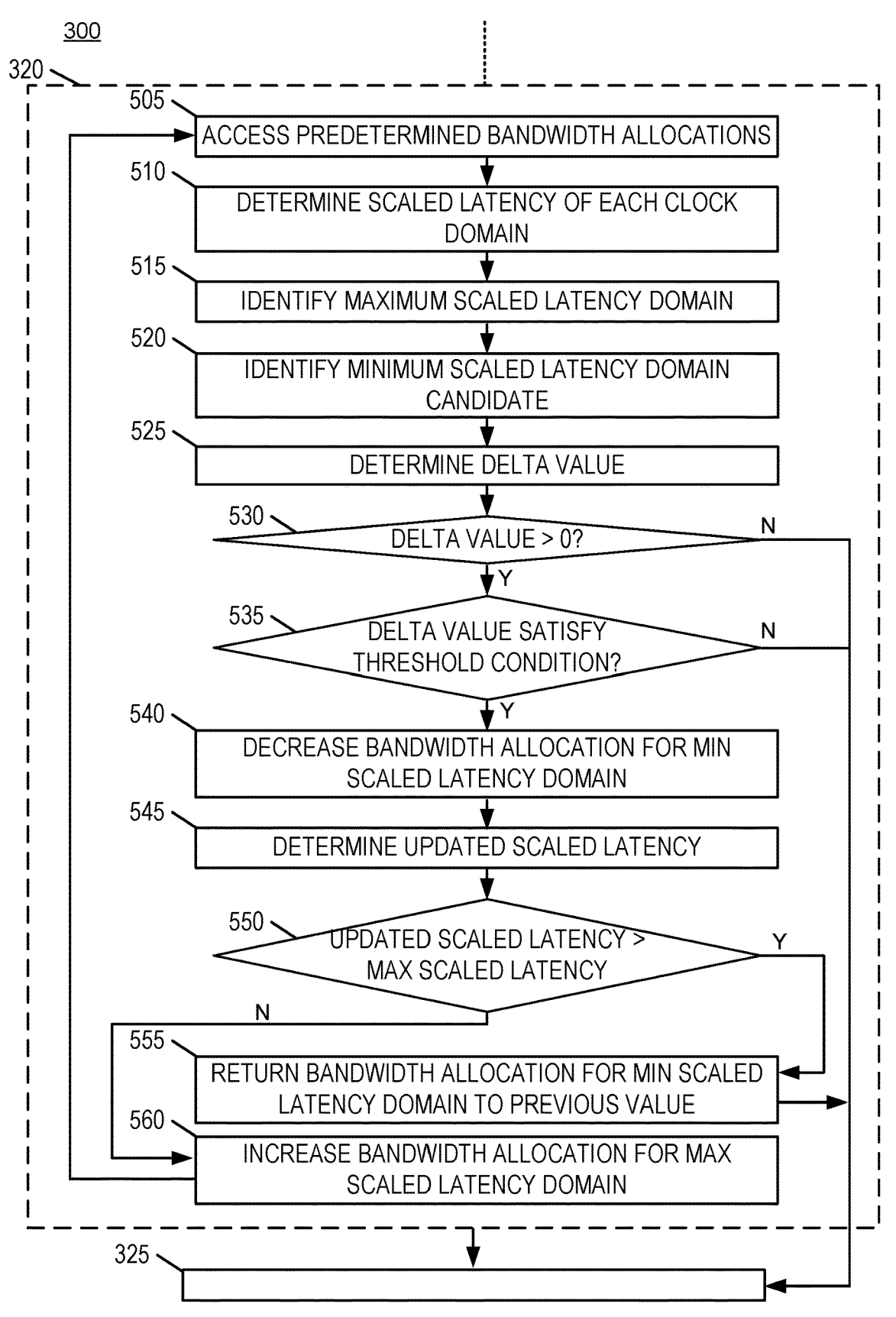

FIGS. 3-5 are flowcharts illustrating operations of a method 300 for multi-clock prototyping that includes a multiplexing scheme that utilizes bandwidth allocation techniques, according to some example embodiments. It will be understood that the method 300 may be performed by a device, such as a computing device executing instructions of an EDA software system. For instance, the operations of the method 300 may be represented by executable instructions (e.g., EDA software) that, when executed by a processor of a computing device, cause the computing device to perform the method 300. Thus, an operation of the method 300 may be performed by a hardware processor (e.g., CPU or GPU) of a computing device (e.g., desktop, server, etc.). Accordingly, the method 300 is described below with reference to such a computing device.

Depending on the embodiment, an operation of the method 300 may be repeated in different ways or involve intervening operations not shown. Though the operations of the method 300 may be depicted and described in a certain order, the order in which the operations are performed may vary among embodiments, including performing certain operations in parallel.

The method 300, as illustrated, begins, at operation 305, where the computing device accesses data describing an IC design (also referred to herein as "IC design data") from memory. The IC design data can comprise or correspond to one or more IC design files stored in memory. The IC design is partitioned into multiple partitions, each of which may comprise one or more cells (e.g., logic gates). The IC design data specifies cut nets between partitions. For example, the IC design data specifies a set of cut nets between a first partition and a second partition.

The IC design may further include multiple clock domain. That is, multiple clock signals can be used for performing timing analysis of clock paths within the design. Each clock signal has a different frequency. Clock paths that share the same clock signal are grouped into a clock domain. Hence, cut nets in the set of cut nets between the first partition and the second partition belong to one of multiple clock domains.

At operation 310, the computing device identifies multiple clock domains in the IC design. Each clock domain includes a subset of the cut nets between the first partition and the second partition. In an example, the computing device identifies a first subset of cut nets of a first clock domain associated with a first clock frequency and a second subset of cut nets of a second clock domain associated with a second clock frequency.

The computing device, at operation 315, assigns a multiplexer/demultiplexer pair to each clock domain. For example, the computing device may assign a first multiplexer/demultiplexer pair to the first subset of cut nets of the first clock domain and assign a second multiplexer/demultiplexer pair to the second subset of cut nets of the second clock domain.

The computing device determines bandwidth allocations for each clock domain, at operation 320. For a given clock domain, the bandwidth allocation comprises a number of links between the first partition and the second partition (e.g., a number of pins connecting the first FPGA to the second FPGA) allocated to the multiplexer and demultiplexer assigned to the clock domain. For some embodiments, the computing device determines the bandwidth allocation for a given clock domain based on a cut size (e.g., a number of cut nets) of the clock domain and a frequency of the clock signal for the clock domain. As an example, the computing device may determine a first bandwidth allocation for the first subset of cut nets based on a cut size of the first subset of cut nets and the first clock frequency and the computing device may determine a second bandwidth allocation for the second subset of cut nets based on a cut size of the second subset of cut nets and the second clock frequency.

At operation 325, the computing device generates a prototype for the IC design (e.g., an FPGA-based prototype) based on the determined bandwidth allocations. For example, the computing device may configure a first FPGA to include the first partition of the IC design and configure a second FPGA to include the second partition of the IC design. The computing device further configures the first and second FPGAs to include the multiplexer/demultiplexer pair assigned to each clock domain. That is, for a given clock domain, the computing device may configure the first FPGA to include a multiplexer and configure the second FPGA to include a demultiplexer.

In addition, as part of generating the prototype, the computing device allocates bandwidth to each clock domain in accordance with the bandwidth allocations determined for each clock domain. In allocating bandwidth for a given clock domain, the computing device allocates a number of links between the first FPGA and the second FPGA to the multiplexer/demultiplexer pair assigned to the clock domain. That is, the computing device assigns links between the first and second FPGA to the multiplexer/demultiplexer pair. The computing device may configure the first FPGA (e.g., corresponding to the first partition) to include a multiplexer and configure the second FPGA to include a demultiplexer. The computing device may further configure the first and second FPGAs such that the multiplexer and demultiplexer include the number of links specified by the bandwidth allocation. The computing device further configures the first and second FPGA such that the multiplexer includes a number of inputs corresponding to the number of cut nets in the clock domain and the demultiplexer includes a number of outputs corresponding to the number of cut nets.

In generating the prototype, the computing device may generate one or more sets of instructions (e.g., in the form of a hardware description language (HDL)), which may be in the form of one or more digital files (e.g., one or more HDL files), that configure the first and second FPGA according to the IC design. The computing device may store the one or more sets of instructions in memory and may provide the one or more sets of instructions to the first and second FPGA via one or more interfaces of the first and second FPGA.

As shown in FIG. 4, the method 300 may, in some embodiments, include operations 405, 410, 415, and 420. Consistent with these embodiments, the operations 405, 410, 415, and 420 can be performed as part of the operation 320 where the computing device determines a bandwidth allocation for each clock domain. Although the description that follows addresses only a single clock domain (e.g., a single subset of cut nets), it shall be appreciated that the operations 405, 410, 415, and 420 can be repeated for each clock domain in the IC design.

At operation 405, the computing device determines a cut size of a clock domain. The "cut size" of the clock domain refers to a number of cut nets in the clock domain. For example, the computing device may determine the cut size of a first subset of cut nets in a first clock domain based on the number of cut nets in the first subset of cut nets.

The computing device computes, at operation 410, a frequency ratio for the clock domain. The computing device determines the frequency ratio for the clock domain based on a comparison of the clock frequency of the clock domain with a lowest clock frequency among the clock domains. As an example, for a clock domain i the computing device computes a ratio of the clock domain i frequency $f_i$ to the lowest clock domain frequency $f_{min}$, for example, as follows:

$$\text{min\_freq\_ratio}_i = f_i / f_{min}.$$

At operation 415, the computing device calculates a product of the frequency ratio of the clock domain and a cut size of the clock domain (i.e., $f_{ratio} * \text{cut size}_i$). The computing device, at operation 420, computes the bandwidth allocation for the clock domain based on the product of the frequency ratio and the cut size. For some embodiments, the computed bandwidth allocation is proportional to the product of the frequency ratio and the cut size. As an example, a set of cut nets in a clock domain i with clock frequency $f_i$ is denoted by $SN_{fi}$ and the computing device may determine the bandwidth allocation (BW) for $SN_{fi}$ as follows:

$$BW(SN_{fi}) = BW(P, Q) * \min freq \ \text{ratio}_i * \left( \frac{\text{cut size}_{SNfi}}{FwTotCutnets} \right)$$

where BW (P,Q) is comprises a fixed number of links between the first partition and the second partition (e.g., a fixed number of pins used to connect a first FPGA and second FPGA), cut size$_{SNfi}$ is the total number of cut nets in $SN_{fi}$, and FwTotCutnets is a frequency weighted total cut nets value, which can be expressed as follows:

$$FwTotCutnets = \sum_{i=1}^{n} f_i * \text{cut size}_i$$

where n is the total number of clock domains.

To provide a more concrete example of the foregoing, reference is made in the following discussion back to the IC design 200 of FIG. 2. In the example illustrated by FIG. 2: BW (P, Q)=24, SNf1=100, SN f2=100, SN f3=100 and f1=1, f2=2, f3=3. Thus, the total number of cut nets is 300 (100+100+100) and the frequency weighted total cut nets value can be determined as follows:

$$FwTotCutnets = 1*100 + 2*100 + 3*100 = 600.$$

Thus, the bandwidth allocations for each set of cut nets is determined as follows:

$$BW(SN_{f1}) = 24*(1/1)*100/600 = 4$$

$$BW(SN_{f2}) = 24*(2/1)*100/600 = 8$$

$$BW(SN_{f3}) = 24*(3/1)*100/600 = 12$$

As shown in FIG. 5, the method 300 may, in some embodiments, further include operations 505, 510, 515, 520, 525, 530, 535, 540, 545, 550, 555, and 560. Consistent with these embodiments, the operations 505, 510, 515, 520, 525, 530, 535, 540, 545, 550, 555, and 560 can be performed as part of the operation 320 where the computing device determines a bandwidth allocation for each clock domain.

At operation 505, the computing device accesses, from memory, predetermined bandwidth allocations for the multiple clock domains in the IC design. For some embodiments, the bandwidth allocations may be determined in accordance with the operations 405, 410, and 415 described above. For some embodiments, the bandwidth allocations correspond to bandwidth allocations determined through a previous iteration of the operations 505, 510, 515, 520, 525, 530, 535, 540, 545, 550, 555, and 560. For some embodiments, the bandwidth allocations can be based on uniform bandwidth allocation across all clock domains. In the discussion that follows, the predetermined bandwidth allocated to clock domain i is denoted by $bw_i$.

The computing device calculates, at 510, a scaled latency of each clock domain based on the bandwidth allocations. As used herein, "latency" refers to a number of clock cycles for multiplexing by a multiplexer/demultiplexing pair. In this context, the latency is scaled by a frequency ratio ($max\_freq\_ratio_i$). As an example, the computing device may calculate the scaled latency of clock domain i as follows:

$$scaled\ latency_i = \frac{fixed\ latency + \frac{cutsize_i}{bw_i}}{max\ freq\ ratio_i}$$

Where fixed latency is a predetermined value (e.g., accessed from memory) that is based on the TDM scheme of the multiplexer/demultiplexer pair (e.g., simple, ultra-high speed TDM or optical cables) and the max freq ratio$_i$ is calculated as follows:

$$max\_freq\_ratio_i = f_i/f_{max}$$

where $f_{max}$ corresponds to the highest frequency clock among the clock domains (also referred to as the "highest frequency clock domain"). Regarding fixed latency, TABLE 1 (presented below) provides example values for each TDM scheme.

TABLE 1

| TDM scheme | Fixed Latency |
|---|---|
| Simple | max(1, tdm ratio) |
| USTDM | 4, 5, 6 |
| QSFP | 14-21 |

At operation 515, the computing device identifies a clock domain with the highest scaled latency (also referred to as the "maximum scaled latency domain"). The computing device further identifies a clock domain with the lowest scaled latency among clock domains with a bandwidth allocation that satisfies a threshold condition (also referred to as the "minimum scaled latency domain candidate"), at operation 520. The threshold condition may, for example, comprise a predetermined threshold bandwidth value defining a minimum bandwidth allocation for all clock domains. That is, the threshold bandwidth value defines a minimum bandwidth that can be allocated to a clock domain in the IC design.

The computing device determines, at operation 525, a delta value corresponding to a difference between the scaled latency of the maximum scaled latency domain (also referred to as the "maximum scaled latency") and the scaled latency of the minimum scaled latency domain candidate (also referred to as the "minimum scaled latency"). As an example, the computing device may determine the delta value as follows:

$$\Delta = max\ scaled\ latency - min\ scaled\ latency$$

At operation 530, the computing device determines whether the delta value is a positive non-zero value. If the delta value is not a positive non-zero value, the computing device maintains current bandwidth allocations and the method 300 proceeds to the operation 325.

If the delta value is a positive non-zero value, the computing device determines, at operation 535, whether the delta value satisfies a threshold condition. The threshold condition may define a threshold delta value, and if the delta value exceeds the threshold delta value, the computing device determines the delta value satisfies the threshold condition.

If the delta value does not satisfy the threshold condition (e.g., if the delta value does not exceed the threshold delta value), the computing device maintains current bandwidth allocations and the method 300 proceeds to the operation 325.

If the delta value satisfies the threshold condition, the computing device decreases the bandwidth allocation for the minimum scaled latency domain, at operation 540. For some embodiments, the computing device decreases the bandwidth allocation for the minimum scaled latency domain by the threshold bandwidth value.

At operation 545, the computing device determines an updated scaled latency for the minimum scaled latency domain based on the decreased bandwidth allocation. The computing device, at operation 550, determines whether updated scaled latency exceeds the maximum scaled latency. If the updated scaled latency exceeds the maximum scaled latency, the computing device returns the bandwidth allocation for the minimum scaled latency domain to the previous value before the decrease (operation 555) and the method 300 proceeds to the operation 325.

If the updated scaled latency does not exceed the maximum scaled latency, the computing device increases the bandwidth allocation of the maximum scaled latency domain, at operation 560, and the method returns to operation 505. The computing device increases the bandwidth allocation for the maximum scaled latency domain by the same amount the bandwidth allocation of the minimum scaled latency domain is decreased, which for some embodiments, is the bandwidth threshold value. In this manner, the computing device reallocates a portion of the bandwidth allocated to the minimum scaled latency domain (based on the predetermined bandwidth allocations) to the maximum scaled latency domain.

Figure 6:
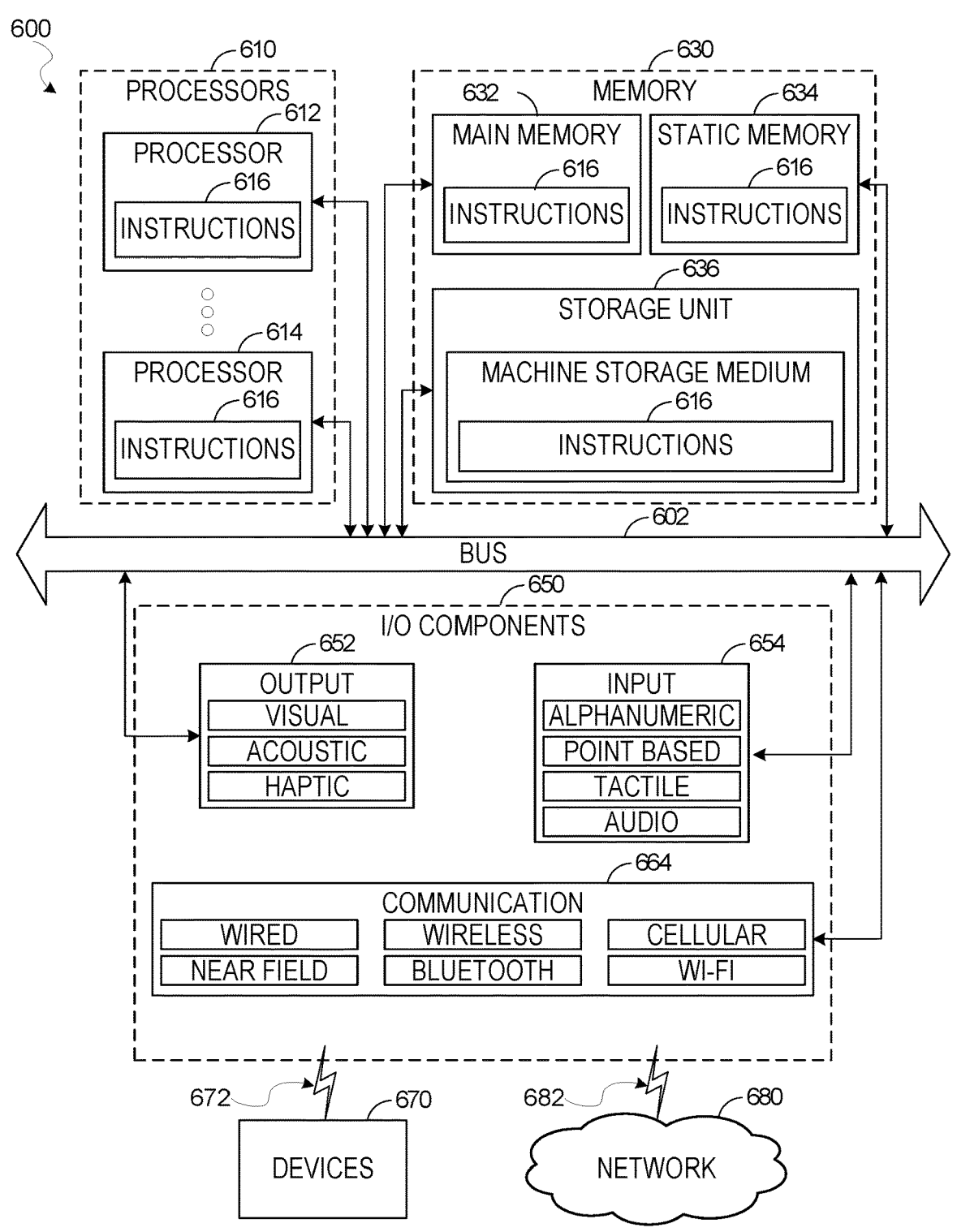
FIG. 6 is a diagrammatic representation of a machine in the example form of a computer system within which a set of instructions for causing the machine to perform any one or more of the methodologies discussed herein may be stored and executed.

FIG. 6 illustrates a diagrammatic representation of a machine 600 in the form of a computer system within which a set of instructions may be executed for causing the machine 600 to perform any one or more of the methodologies discussed herein, according to an example embodiment. Specifically, FIG. 6 shows a diagrammatic representation of the machine 600 in the example form of a computer system, within which instructions 616 (e.g., software, a program, an application, an applet, an app, or other executable code) for causing the machine 600 to perform any one or more of the methodologies discussed herein may be executed. For example, the instructions 616 may cause the machine 600 to execute an EDA software system that executes the method 300. Additionally, or alternatively, the instructions 616 may implement the design flow 100 of FIG. 1. The instructions 616 transform the general, non-programmed machine 600 into a particular machine 600 programmed to carry out the described and illustrated functions in the manner described here. In alternative embodiments, the machine 600 operates as a standalone device or may be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 616, sequentially or otherwise, that specify actions to be taken by the machine 600. Further, while only a single machine 600 is illustrated, the term "machine" shall also be taken to include a collection of machines 600 that individually or jointly execute the instructions 616 to perform any one or more of the methodologies discussed herein.

The machine 600 may include processors 610, memory 630, and input/output (I/O) components 650, which may be configured to communicate with each other such as via a bus 602. In an example embodiment, the processors 610 (e.g., a CPU, a reduced instruction set computing (RISC) processor, a complex instruction set computing (CISC) processor, a GPU, a digital signal processor (DSP), an application-specific integrated circuit (ASIC), a radio-frequency integrated circuit (RFIC), another processor, or any suitable combination thereof) may include, for example, a processor 612 and a processor 614 that may execute the instructions 616. The term "processor" is intended to include multi-core processors 610 that may comprise two or more independent processors (sometimes referred to as "cores") that may execute instructions contemporaneously. Although FIG. 6 shows multiple processors, the machine 600 may include a single processor with a single core, a single processor with multiple cores (e.g., a multi-core processor), multiple processors with a single core, multiple processors with multiple cores, or any combination thereof.

The memory 630 may include a main memory 632, a static memory 634, and a storage unit 636, each accessible to the processors 610 such as via the bus 602. The main memory 632, the static memory 634, and the storage unit 636 store the instructions 616 embodying any one or more of the methodologies or functions described herein. The instructions 616 may also reside, completely or partially, within the main memory 632, within the static memory 634, within the storage unit 636, within at least one of the processors 610 (e.g., within the processor's cache memory), or any suitable combination thereof, during execution thereof by the machine 600.

The I/O components 650 may include a wide variety of components to receive input, provide output, produce output, transmit information, exchange information, capture measurements, and so on. The specific I/O components 650 that are included in a particular machine will depend on the type of machine. For example, portable machines such as mobile phones will likely include a touch input device or other such input mechanisms, while a headless server machine will likely not include such a touch input device. It will be appreciated that the I/O components 650 may include many other components that are not shown in FIG. 6. The I/O components 650 are grouped according to functionality merely for simplifying the following discussion, and the grouping is in no way limiting. In various example embodiments, the I/O components 650 may include output components 652 and input components 654. The output components 652 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components, and so forth. The input components 654 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 650 may include communication components 664 operable to couple the machine 600 to a network 680 or devices 670 via a coupling 682 and a coupling 672, respectively. For example, the communication components 664 may include a network interface component or another suitable device to interface with the network 680. In further examples, the communication components 664 may include wired communication components, wireless communication components, cellular communication components, and other communication components (NFC, Bluetooth, and Wi-Fi) to provide communication via other modalities. The devices 670 may be another machine or any of a wide variety of peripheral devices (e.g., a peripheral device coupled via a universal serial bus (USB)).

The various memories (e.g., 630, 632, 634, and/or memory of the processor(s) 610) and/or the storage unit 636 may store one or more sets of instructions and data structures (e.g., software) embodying or utilized by any one or more of the methodologies or functions described herein. These instructions, when executed by the processor(s) 610, cause various operations to implement the disclosed embodiments.

The terms "machine-storage medium," "device-storage medium," and "computer storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), FPGAs, and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "transmission medium" discussed below.

In various example embodiments, one or more portions of the network 680 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 680 or a portion of the network 680 may include a wireless or cellular network, and the coupling 682 may be a Code Division Multiple Access (CDMA) connection, a Global System for Mobile communications (GSM) connection, or another type of cellular or wireless coupling. In this example, the coupling 682 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 616 may be transmitted or received over the network 680 using a transmission medium via a network interface device (e.g., a network interface component included in the communication components 664) and utilizing any one of a number of well-known transfer protocols (e.g., hypertext transfer protocol (HTTP)). Similarly, the instructions 616 may be transmitted or received using a transmission medium via the coupling 672 (e.g., a peer-to-peer coupling) to the devices 670. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 616 for execution by the machine 600, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

The terms "machine-readable medium," "computer-readable medium," and "device-readable medium" mean the same thing and may be used interchangeably in this disclosure. The terms are defined to include both machine-storage media and transmission media. Thus, the terms include both storage devices/media and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:
1. A system comprising:
one or more processors of a machine; and
a computer storage medium storing instructions, which when executed by the machine, cause the machine to perform operations comprising:
accessing, from memory, data representing an integrated circuit design, the integrated circuit design comprising multiple partitions, the integrated circuit design specifying a set of cut nets between a first partition and a second partition;

identifying a plurality of clock domains among the set of cut nets, a clock domain among the plurality of clock domains comprising a subset of cut nets from the set of cut nets;

computing bandwidth allocations for the plurality of clock domains, the computing of the bandwidth allocations comprising computing a first bandwidth allocation for the clock domain, the first bandwidth allocation corresponding to a number of links between the first partition and the second partition allocated to a multiplexer/demultiplexer pair assigned to the clock domain; and generating a prototype of the integrated circuit design based on the bandwidth allocations for the plurality of clock domains, the generating of the prototype comprising allocating the number of links between the first partition and the second partition to the multiplexer/demultiplexer pair based on the first bandwidth allocation.

2. The system of claim 1, wherein:

the clock domain is a first clock domain comprising a first subset of cut nets;

the multiplexer/demultiplexer pair is a first multiplexer/demultiplexer pair;

the number of links is a first number of links;

the computing of the bandwidth allocations further comprises computing a second bandwidth allocation for a second clock domain, the second bandwidth allocation corresponding to a second number of links between the first partition and the second partition allocated to a second multiplexer/demultiplexer pair assigned to the second clock domain; and the generating of the prototype of the integrated circuit design based on the bandwidth allocations for the plurality of clock domains further comprises allocating the second number of links between the first partition and the second partition to the second multiplexer/demultiplexer pair based on the second bandwidth allocation.

3. The system of claim 2, wherein the generating of the prototype of the integrated circuit design further comprises:

configuring a first field programmable gate array (FPGA) to include the first partition of the integrated circuit design;

configuring a second FPGA to include the second partition of the integrated circuit design;

allocating the first number of links between the first FPGA and the second FPGA to the first multiplexer/demultiplexer pair; and allocating the second number of links between the first FPGA and the second FPGA to the second multiplexer/demultiplexer pair.

4. The system of claim 1, wherein the operations further comprise assigning a respective multiplexer/demultiplexer pair to each clock domain.

5. The system of claim 1, wherein the computing of the first bandwidth allocation is based on a cut size of the clock domain and a clock frequency of the clock domain.

6. The system of claim 5, wherein: the computing of the first bandwidth allocation comprises:

determining a frequency ratio of the clock domain based on a comparison of a clock frequency of the clock domain and a lowest clock frequency among the plurality of clock domains; and determining a product of the frequency ratio and the cut size of the clock domain, wherein the first bandwidth allocation is proportional to the product.

7. The system of claim 6, wherein determining the frequency ratio comprises calculating a ratio of the clock frequency of the clock domain to a lowest clock domain frequency among the plurality of clock domains.

8. The system of claim 1, wherein determining the bandwidth allocations for the plurality of clock domains comprises:

accessing predetermined bandwidth allocations for the plurality of clock domains;

calculating a scaled latency of each clock domain of the plurality of clock domains based on the predetermined bandwidth allocations;

identifying a maximum scaled latency domain based on the scaled latency calculated for each clock domain;

identifying a minimum scaled latency domain candidate based on the scaled latency calculated for each clock domain; and reallocating a portion of bandwidth allocated to the minimum scaled latency domain based on the predetermined bandwidth allocations to the maximum scaled latency domain.

9. The system of claim 8, wherein the reallocating of the portion of the bandwidth comprises:

decreasing a first predetermined bandwidth allocation for the minimum scaled latency domain candidate by an amount; and increasing a second predetermined bandwidth allocation for the maximum scaled latency domain by the amount.

10. The system of claim 8, wherein the determining of the bandwidth allocations for the plurality of clock domains further comprises:

determining a delta value based on a difference between a maximum scaled latency associated with the maximum scaled latency domain and a minimum scaled latency associated with the minimum scaled latency; and determining whether the delta value satisfies a threshold condition, wherein reallocating the portion of bandwidth allocated to the minimum scaled latency domain to the maximum scaled latency domain is based on determining the delta value satisfies the threshold condition.

11. A method comprising:

accessing, from memory, data representing an integrated circuit design, the integrated circuit design comprising multiple partitions, the integrated circuit design specifying a set of cut nets between a first partition and a second partition;

identifying a plurality of clock domains among the set of cut nets, a clock domain among the plurality of clock domains comprising a subset of cut nets from the set of cut nets;

assigning a multiplexer/demultiplexer pair to each clock domain of the plurality of clock domains;

computing bandwidth allocations for the plurality of clock domains, the computing of the bandwidth allocations comprising computing a first bandwidth allocation for the clock domain, the first bandwidth allocation corresponding to a number of links between the first partition and the second partition allocated to a first multiplexer/demultiplexer pair assigned to the clock domain; and generating a prototype of the integrated circuit design based on the bandwidth allocations for the plurality of clock domains, the generating of the prototype comprising allocating the number of links between the first partition and the second partition to the multiplexer/demultiplexer pair based on the first bandwidth allocation.

12. The method of claim 11, wherein:
the clock domain is a first clock domain comprising a first subset of cut nets;
the number of links is a first number of links;
the computing of the bandwidth allocations further comprises computing a second bandwidth allocation for a second clock domain, the first bandwidth allocation corresponding to a second number of links between the first partition and the second partition allocated to a second multiplexer/demultiplexer pair assigned to the second clock domain; and
the generating of the prototype of the integrated circuit design based on the bandwidth allocations for the plurality of clock domains further comprises allocating the second number of links between the first partition and the second partition to the second multiplexer/demultiplexer pair based on the second bandwidth allocation.

13. The method of claim 12, wherein the generating of the prototype of the integrated circuit design further comprises:
configuring a first field programmable gate array (FPGA) to include the first partition of the integrated circuit design;
configuring a second FPGA to include the second partition of the integrated circuit design;
allocating the first number of links between the first FPGA and the second FPGA to the first multiplexer/demultiplexer pair; and
allocating the second number of links between the first FPGA and the second FPGA to the second multiplexer/demultiplexer pair.

14. The method of claim 11, wherein the computing of the first bandwidth allocation is based on a cut size of the clock domain and a clock frequency of the clock domain.

15. The method of claim 14, wherein: the computing of the first bandwidth allocation comprises:
determining a frequency ratio of the clock domain based on a comparison of a clock frequency of the clock domain and a lowest clock frequency among the plurality of clock domains; and
determining a product of the frequency ratio and the cut size of the clock domain, wherein the first bandwidth allocation is proportional to the product.

16. The method of claim 15, wherein determining the frequency ratio comprises calculating a ratio of the clock frequency of the clock domain to a lowest clock domain frequency among the plurality of clock domains.

17. The method of claim 11, wherein determining the bandwidth allocations for the plurality of clock domains comprises:
accessing predetermined bandwidth allocations for the plurality of clock domains;
calculating a scaled latency of each clock domain of the plurality of clock domains based on the predetermined bandwidth allocations;
identifying a maximum scaled latency domain based on the scaled latency calculated for each clock domain;
identifying a minimum scaled latency domain candidate based on the scaled latency calculated for each clock domain; and
reallocating a portion of bandwidth allocated to the minimum scaled latency domain based on the predetermined bandwidth allocations to the maximum scaled latency domain.

18. The method of claim 17, wherein the reallocating of the portion of the bandwidth comprises:
decreasing a first predetermined bandwidth allocation for the minimum scaled latency domain candidate by an amount; and
increasing a second predetermined bandwidth allocation for the maximum scaled latency domain by the amount.

19. The method of claim 18, wherein the determining of the bandwidth allocations for the plurality of clock domains further comprises:
determining a delta value based on a difference between a maximum scaled latency associated with the maximum scaled latency domain and a minimum scaled latency associated with the minimum scaled latency; and
determining whether the delta value satisfies a threshold condition, wherein reallocating the portion of bandwidth allocated to the minimum scaled latency domain to the maximum scaled latency domain is based on determining the delta value satisfies the threshold condition.

20. A computer storage medium storing instructions, which when executed by a machine, cause the machine to perform operations comprising:
accessing, from memory, data representing an integrated circuit design, the integrated circuit design comprising multiple partitions, the integrated circuit design specifying a set of cut nets between a first partition and a second partition;
identifying a plurality of clock domains among the set of cut nets, a first clock domain among the plurality of clock domains comprising a first subset of cut nets from the set of cut nets, a second clock domain among the plurality of clock domains comprising a second subset of cut nets from the set of cut nets;
computing bandwidth allocations for the plurality of clock domains, the computing of the bandwidth allocations comprising:
computing a first bandwidth allocation for the first clock domain, the first bandwidth allocation corresponding to a first number of links between the first partition and the second partition allocated to a first multiplexer/demultiplexer pair assigned to the first clock domain; and
computing a second bandwidth allocation for the second clock domain, the second bandwidth allocation corresponding to a second number of links between the first partition and the second partition allocated to a second multiplexer/demultiplexer pair assigned to the second clock domain; and
generating a prototype of the integrated circuit design based on the bandwidth allocations for the plurality of clock domains, the generating of the prototype comprising:
allocating the first number of links between the first partition and the second partition to the first multiplexer/demultiplexer pair based on the first bandwidth allocation; and
allocating the second number of links between the first partition and the second partition to the second multiplexer/demultiplexer pair based on the second bandwidth allocation.

* * * * *